US006261963B1

(12) United States Patent
Zhao et al.

(10) Patent No.: US 6,261,963 B1
(45) Date of Patent: Jul. 17, 2001

(54) REVERSE ELECTROPLATING OF BARRIER METAL LAYER TO IMPROVE ELECTROMIGRATION PERFORMANCE IN COPPER INTERCONNECT DEVICES

(75) Inventors: Larry Zhao; Paul R. Besser; Eric M. Apelgren, all of Austin, TX (US); Christian Zistl, Dresden (DE); Jonathan B. Smith, Fremont, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/611,729

(22) Filed: Jul. 7, 2000

(51) Int. Cl.[7] .................................................. H01L 21/302
(52) U.S. Cl. .......................... 438/704; 438/687; 438/927; 438/725; 438/694; 438/723; 438/704; 204/129.1
(58) Field of Search ..................................... 438/687, 927, 438/757, 725, 740, 692, 723, 704, 694; 204/129.1

(56) References Cited

U.S. PATENT DOCUMENTS

| | | | |
|---|---|---|---|
| 5,494,860 | * | 2/1996 | McDevitt et al. .................... 437/246 |
| 5,814,557 | * | 9/1998 | Venkatraman et al. .............. 438/622 |
| 5,925,933 | * | 7/1999 | Colgan et al. ........................ 257/762 |
| 6,030,895 | * | 2/2000 | Joshi et al. ........................... 438/679 |
| 6,184,121 | * | 2/2001 | Buchwalter et al. ................ 438/622 |

* cited by examiner

Primary Examiner—Gregory Mills
Assistant Examiner—George Goudreau
(74) Attorney, Agent, or Firm—Williams, Morgan & Amerson

(57) ABSTRACT

A method is provided for forming a conductive interconnect, the method comprising forming a first dielectric layer above a structure layer, forming a first opening in the first dielectric layer, and forming a first conductive structure in the first opening. The method also comprises forming a second dielectric layer above the first dielectric layer and above the first conductive structure, forming a second opening in the second dielectric layer above at least a portion of the first conductive structure, the second opening having a side surface and a bottom surface, and forming at least one barrier metal layer in the second opening on the side surface and on the bottom surface. In addition, the method comprises removing a portion of the at least one barrier metal layer from the bottom surface, and forming a second conductive structure in the second opening, the second conductive structure contacting the at least the portion of the first conductive structure. The method further comprises forming the conductive interconnect by annealing the second conductive structure and the first conductive structure.

40 Claims, 10 Drawing Sheets

REVERSE ELECTROPLATING OF BARRIER METAL LAYER TO IMPROVE ELECTROMIGRATION PERFORMANCE IN COPPER INTERCONNECT DEVICES

BACKGROUND OF THE INVENTION

1. Field of the Invention

This invention relates generally to semiconductor fabrication technology, and, more particularly, to techniques for filling contact openings and vias with copper and creating copper interconnections and lines.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the size, or scale, of the components of a typical transistor also requires reducing the size and cross-sectional dimensions of electrical interconnects to contacts to active areas, such as $N^+$ ($P^+$) source/drain regions and a doped-polycrystalline silicon (doped-polysilicon or doped-poly) gate conductor, and the like. As the size and cross-sectional dimensions of electrical interconnects get smaller, resistance increases and electromigration increases. Increased resistance and electromigration are undesirable for a number of reasons. For example, increased resistance may reduce device drive current, and source/drain current through the device, and may also adversely affect the overall speed and operation of the transistor. Additionally, electromigration effects in aluminum (Al) interconnects, where electrical currents actually carry Al atoms along with the electron "wind," causing the Al atoms to electromigrate, may lead to degradation of the Al interconnects, formation of voids, further increased resistance, and even disconnection and/or delamination of the Al interconnects.

The ideal interconnect conductor for semiconductor circuitry will be inexpensive, easily patterned, have low resistivity, and high resistance to corrosion, electromigration, and stress migration. Aluminum (Al) is most often used for interconnects in contemporary semiconductor fabrication processes primarily because Al is inexpensive and easier to etch than, for example, copper (Cu). However, because Al has insufficient electromigration characteristics and high susceptibility to stress migration, it is typical to alloy Al with other metals.

As discussed above, as semiconductor device geometries shrink and clock speeds increase, it becomes increasingly desirable to reduce the resistance of the circuit metallization.

The one criterion that is most seriously compromised by the use of Al for interconnects is that of conductivity. This is because the three metals with lower resistivities (Al has a resistivity of $2.824 \times 10^{-6}$ ohms-cm at 20° C.), namely, silver (Ag) with a resistivity of $1.59 \times 10^{-6}$ ohms-cm (at 20° C.), copper (Cu) with a resistivity of $1.73 \times 10^{-6}$ ohms-cm (at 20° C.), and gold (Au) with a resistivity of $2.44 \times 10$ ohms-cm (at 20° C.), fall short in other significant criteria. Silver, for example, is relatively expensive and corrodes easily, and gold is very costly and difficult to etch. Copper, with a resistivity nearly on par with silver, substantial immunity from electromigration, high ductility (which provides high immunity to mechanical stresses generated by differential expansion rates of dissimilar materials in a semiconductor chip) and high melting point (1083° C. for Cu vs. 659° C. for Al), fills most criteria admirably. However, Cu is difficult to etch in a semiconductor environment. As a result of the difficulty in etching Cu, an alternative approach to forming vias and metal lines must be used. The damascene approach, consisting of etching openings such as trenches in the dielectric for lines and vias and creating in-laid metal patterns, is the leading contender for fabrication of sub-0.25 micron (sub-0.25$\mu$) design rule conductive material-metallized circuits.

However, even with Cu interconnects, while electromigration effects are much less severe than with Al interconnects, some adverse electromigration effects remain and affect the performance of the Cu interconnects. In particular, electromigration voids may occur in Cu interconnects in vias, which are typically narrower than trenches and contact holes, due to the interaction of the electron wind and the Cu atoms. One or more barrier metal layers are typically used to protect silicon (Si) in the semiconductor devices from being poisoned by Cu atoms diffusing from the Cu interconnect into the Si. The barrier layer(s) at the bottom of openings such as contact holes, trenches, via, and the like, also contribute to the formation of electromigration voids by acting as a barrier between the Cu interconnect and the underlying Cu structure and/or line to which the Cu interconnect is connecting. The barrier layer(s) at the bottom of openings cause local heating, increasing the formation of electromigration voids, and also prevent Cu atoms in the Cu interconnect in the via from diffusing into the underlying Cu structure and/or line to which the Cu interconnect is connecting, further increasing the formation of electromigration voids.

The present invention is directed to overcoming, or at least reducing the effects of, one or more of the problems set forth above.

SUMMARY OF THE INVENTION

In one aspect of the present invention, a method is provided for forming a conductive interconnect, the method comprising forming a first dielectric layer above a structure layer, forming a first opening in the first dielectric layer, and forming a first conductive structure in the first opening. The method also comprises forming a second dielectric layer above the first dielectric layer and above the first conductive structure, forming a second opening in the second dielectric layer above at least a portion of the first conductive structure, the second opening having a side surface and a bottom surface, and forming at least one barrier metal layer in the second opening on the side surface and on the bottom surface. In addition, the method comprises removing a portion of the at least one barrier metal layer from the bottom surface, and forming a second conductive structure in the second opening, the second conductive structure contacting the at least the portion of the first conductive structure. The method further comprises forming the conductive interconnect by annealing the second conductive structure and the first conductive structure.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
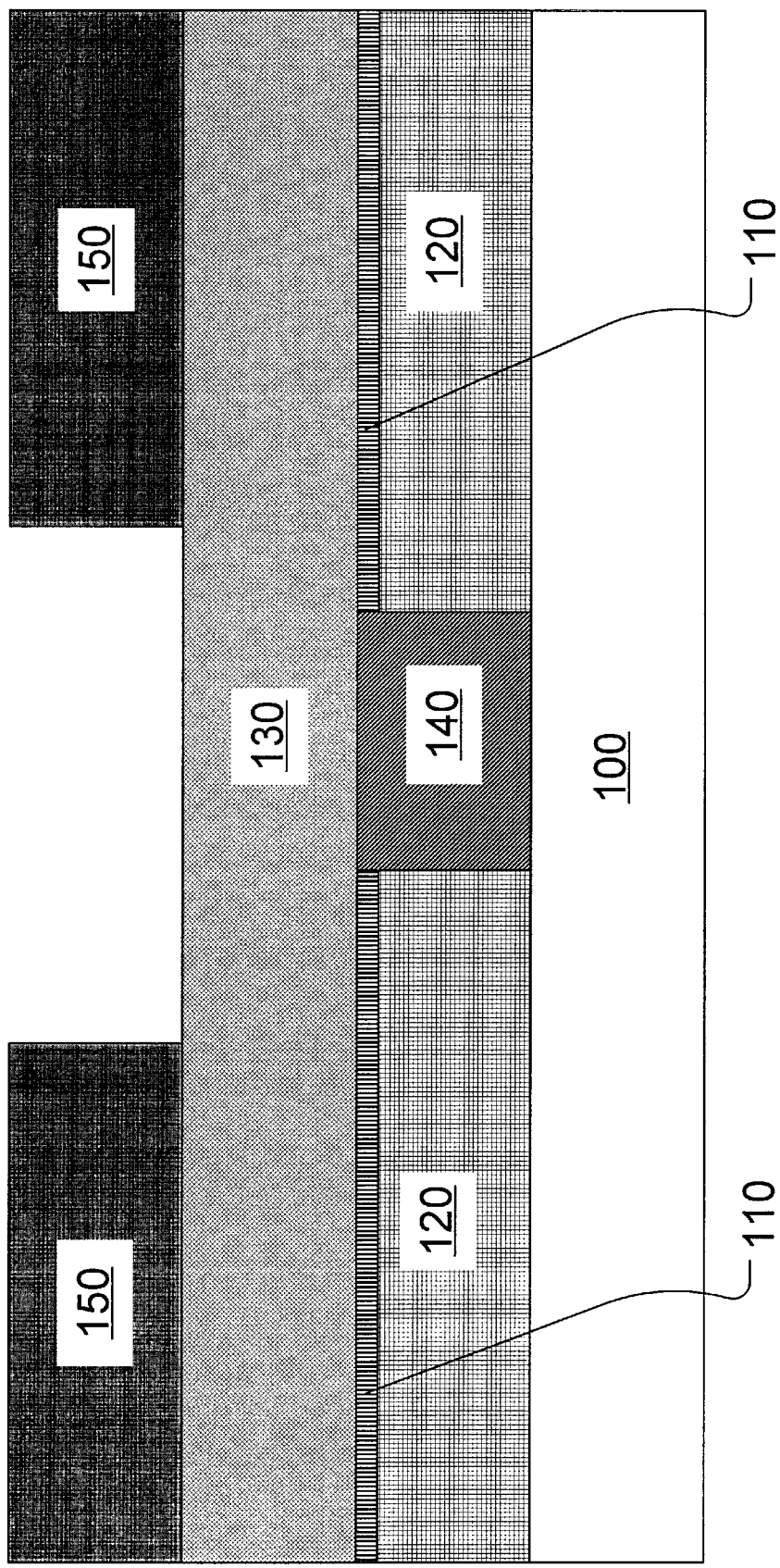
FIGS. 1–8 schematically illustrate a single-damascene copper interconnect process flow according to various embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers'specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 1–10. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

As shown in FIG. 1, a first dielectric layer 120 and a first conductive structure 140 (such as a copper intermetal via connection) may be formed above a structure 100 such as a semiconducting substrate. However, the present invention is not limited to the formation of a conductive material-based interconnect above the surface of a semiconducting substrate such as a silicon wafer, for example. Rather, as will be apparent to one skilled in the art upon a complete reading of the present disclosure, a conductive material-based interconnect formed in accordance with the present invention may be formed above previously formed semiconductor devices and/or process layer, e.g., transistors, or other similar structure. In effect, the present invention may be used to form process layers on top of previously formed process layers. The structure 100 may be an underlayer of semiconducting material, such as a silicon substrate or wafer, or, alternatively, may be an underlayer of semiconductor devices (see FIG. 10, for example), such as a layer of metal oxide semiconductor field effect transistors (MOSFETs), and the like, and/or a metal interconnection layer or layers (see FIG. 9, for example) and/or an interlayer dielectric (ILD) layer or layers, and the like.

In a single-damascene copper process flow, according to various embodiments of the present invention, as shown in FIGS. 1–8, the first dielectric layer 120 is formed above the structure 100, adjacent the first conductive structure 140. A second dielectric layer 130 is formed above the first dielectric layer 120 and above the first conductive structure 140. A patterned photomask 150 is formed above the second dielectric layer 130. The first dielectric layer 120 has the first conductive structure 140 disposed therein. The first dielectric layer 120 has an etch stop layer (ESL) 110 (typically silicon nitride, $Si_3N_4$, or SiN, for short) formed and patterned thereon, between the first dielectric layer 120 and the second dielectric layer 130 and adjacent the first conductive structure 140. If necessary, the second dielectric layer 130 may have been planarized using chemical-mechanical planarization (CMP).

The first and second dielectric layers 120 and 130 may be formed from a variety of "low dielectric constant" or "low K" (K is less than or equal to about 4) dielectric materials. The low K first and second dielectric layers 120 and 130 may be formed by a variety of known techniques for forming such layers, e.g., chemical vapor deposition (CVD), low-pressure CVD (LPCVD), plasma-enhanced CVD (PECVD), spin-on glass, and the like, and each may have a thickness ranging from approximately 1000 Å–8000 Å, for example.

The low K first and second dielectric layers 120 and 130 may be formed from a variety of low K dielectric materials, where K is less than or equal to about 4. Examples include Applied Material's Black Diamond®, Novellus'Coral®, Allied Signal's Nanoglass®, JSR's LKD5104, monomethyl silane, trimethyl silane, fluorinated tetraethyl orthosilicate (FTEOS), hydrogen silsesquioxane (HSQ), and the like. In one illustrative embodiment, the low K first and second dielectric layers 120 and 130 are each comprised of Applied Material's Black Diamond®, each having a thickness of approximately 5000 Å, each being formed by being blanket-deposited by an LPCVD process for higher throughput.

Figure 2:
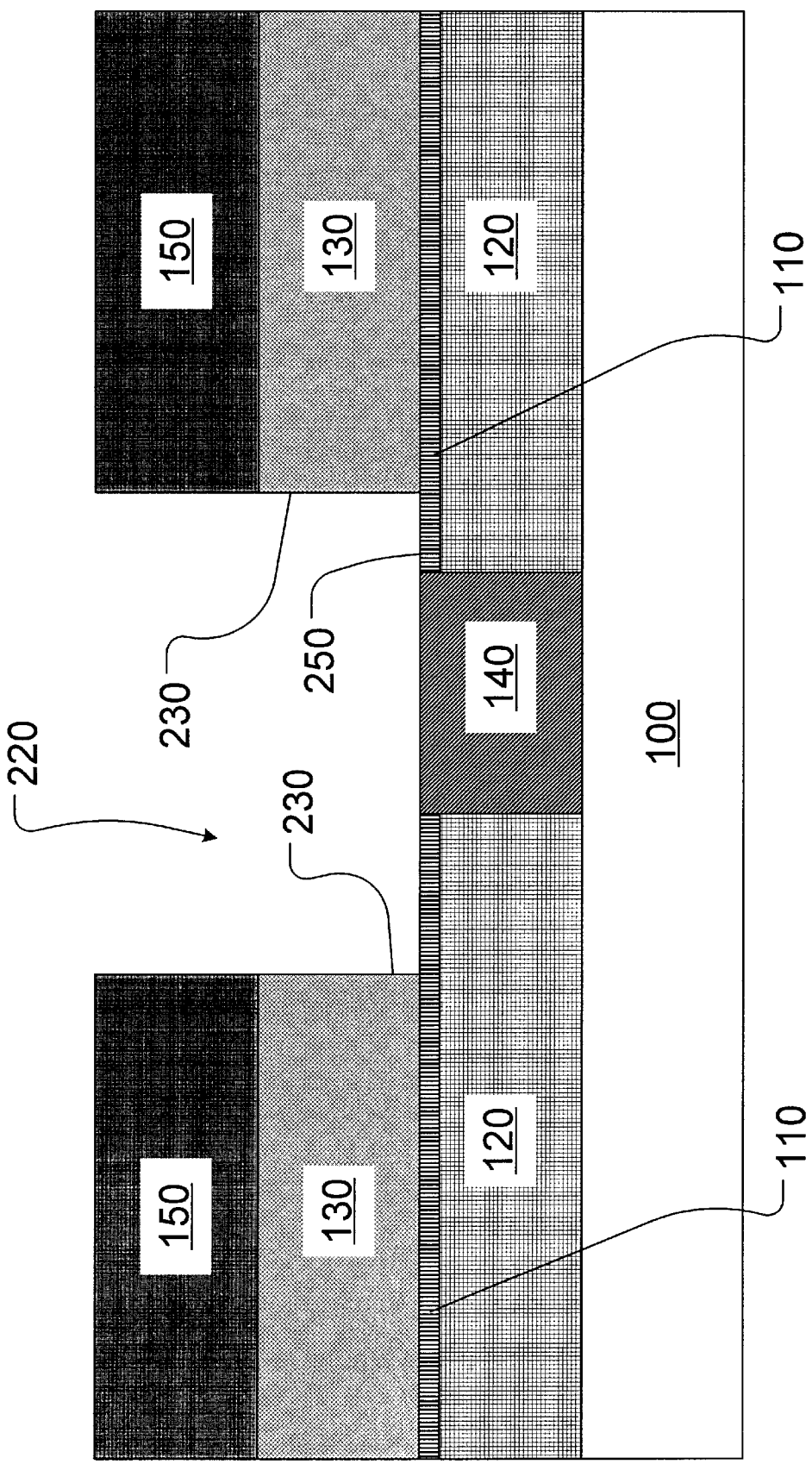

As shown in FIG. 2, a metallization pattern is then formed by using the patterned photomask 150, the etch stop layer 110 (FIGS. 1–2), and photolithography. For example, openings (such as an opening or trench 220 formed above at least a portion of the first conductive structure 140) for conductive metal lines, contact holes, via holes, and the like, are etched into the second dielectric layer 130 (FIG. 2). The opening 220 has side surfaces 230 and a bottom surface 250. The opening 220 may be formed by using a variety of known anisotropic etching techniques, such as a reactive ion etching (RIE) process using hydrogen bromide (HBr) and argon (Ar) as the etchant gases, for example. Alternatively, an RIE process with $CHF_3$ and Ar as the etchant gases may be used, for example. Dry etching may also be used in various illustrative embodiments. The etching may stop at the etch stop layer 110 and at the first conductive structure 140.

Figure 3:
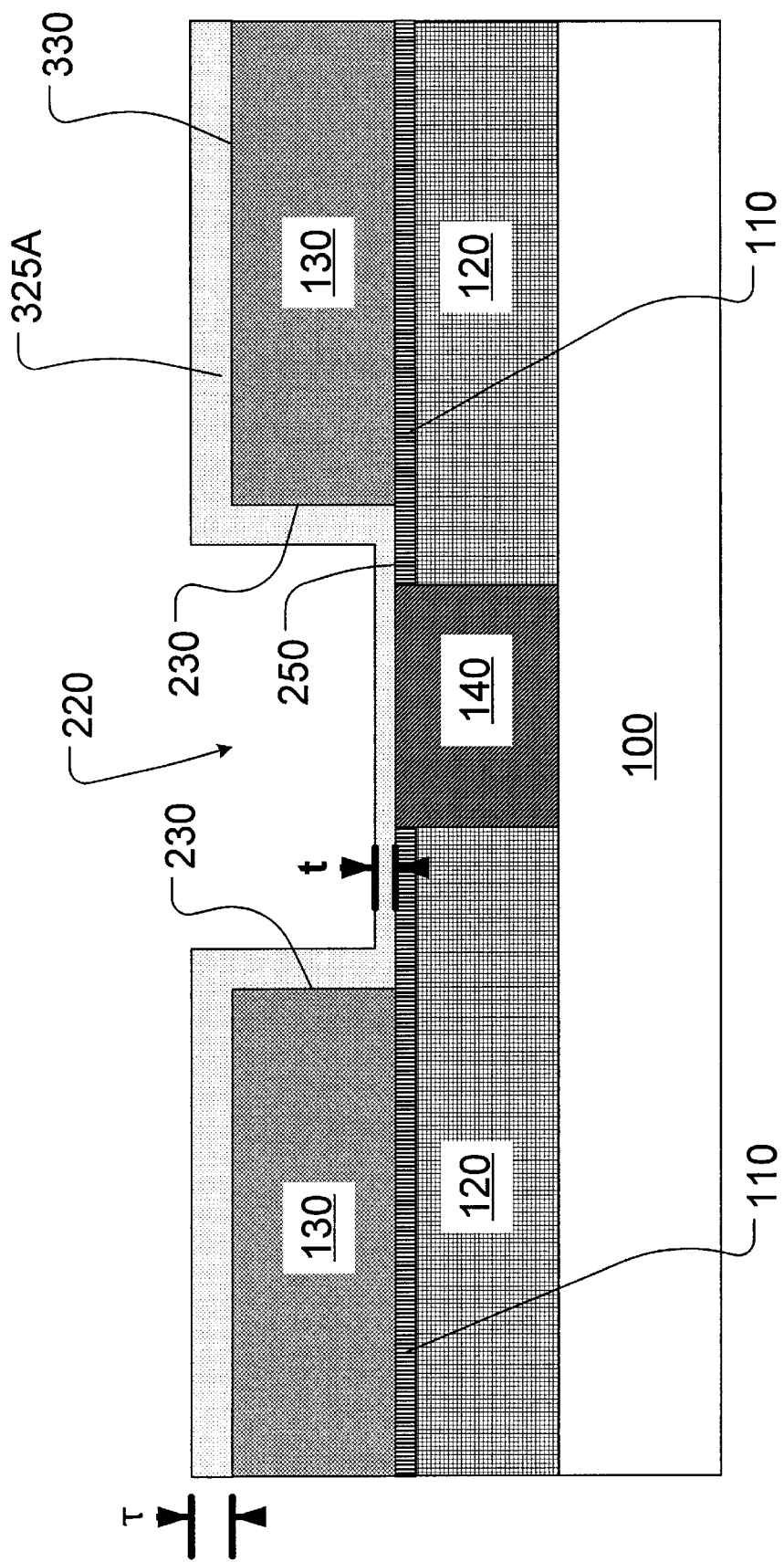

As shown in FIG. 3, the patterned photomask 150 is then stripped and a thin barrier metal layer 325A is applied to the entire surface using vapor-phase deposition. The barrier metal layer 325A blanket-deposits an entire upper surface 330 of the second dielectric layer 130 as well as the side surfaces 230 and the bottom surface 250 of the trench 220. As shown in FIG. 3, the barrier metal layer 325A may have a thickness T above the upper surface 330 of the second dielectric layer 130 and along the side surfaces 230 of the opening 220, where the thickness $\tau$ is in a range of about 200 Å–1000 Å, for example. As shown in FIG. 3, the barrier metal layer 325A may have a thickness t above the bottom surface 250 of the opening 220, where the thickness t is in a range of about 50 Å–500 Å, for example, or about half the thickness $\tau$.

The barrier metal layer 325A may be formed of at least one layer of a barrier metal material, such as tantalum or tantalum nitride, and the like. For example, the barrier metal layer 325A may also be formed of titanium nitride, titanium-tungsten, nitrided titanium-tungsten, magnesium, or another suitable barrier material.

Figure 4:
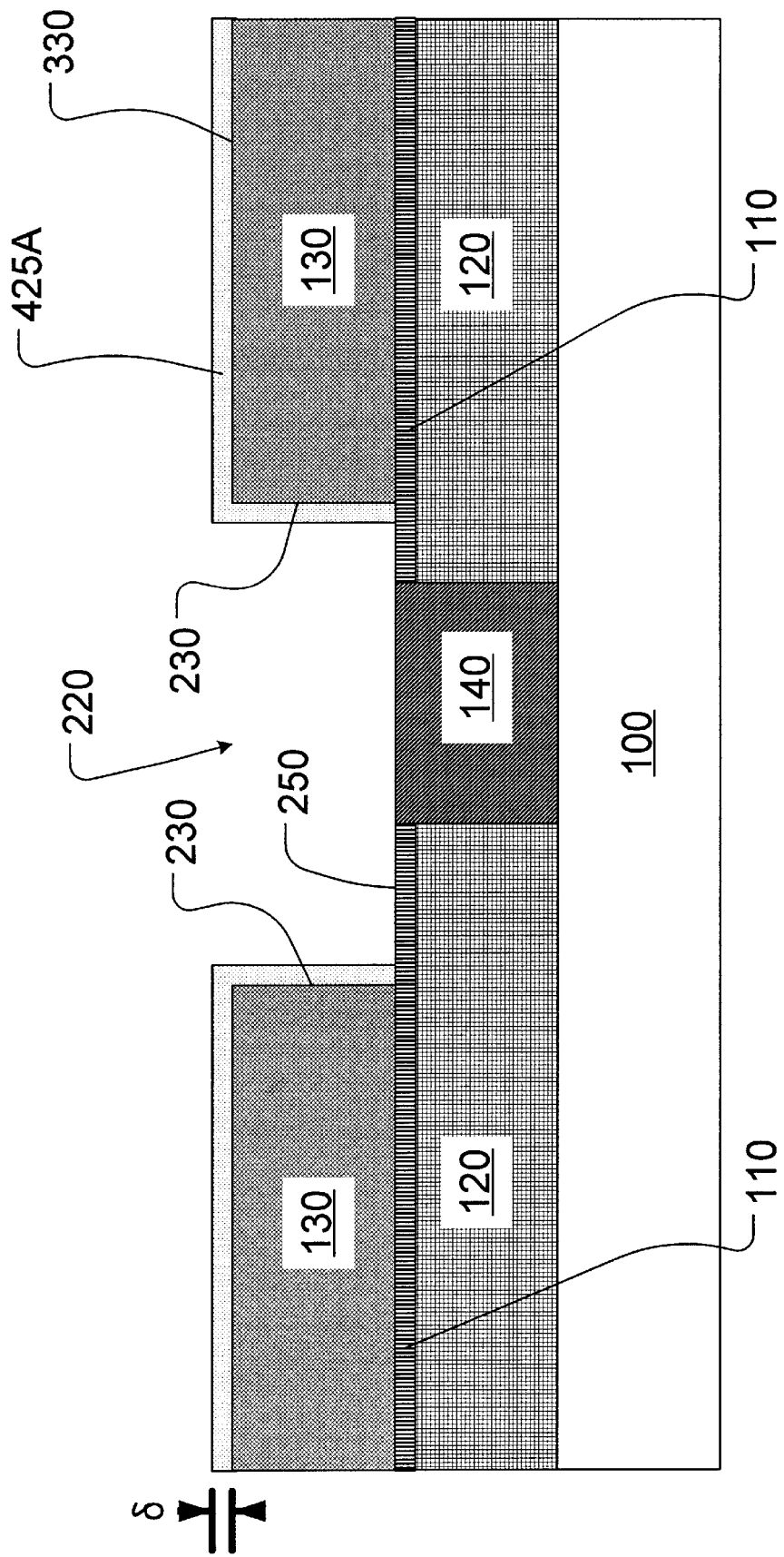

As shown in FIG. 4, the one or more barrier metal layer(s) 325A above the bottom surface 250 of the opening 220 (FIG. 3) may be removed using reverse electroplating of the one or more barrier metal layer(s) 325A. In particular, the reverse electroplating of the one or more barrier metal layer(s) 325A will remove the one or more barrier metal layer(s) 325A from above the first conductive structure 140. The reverse electroplating of the one or more barrier metal layer(s) 325A will also remove a portion of the one or more barrier metal layer(s) 325A above the upper surface 330 of the second dielectric layer 130 and along the side surfaces 230 of the opening 220, forming one or more reduced barrier metal layer(s) 425A. The one or more reduced barrier metal layer(s) 425A may have a thickness $\delta$ above the upper surface 330 of the second dielectric layer 130 and along the side surfaces 230 of the opening 220, where the thickness $\delta$ is in a range of about 50 Å–500 Å, for example.

Figure 5:
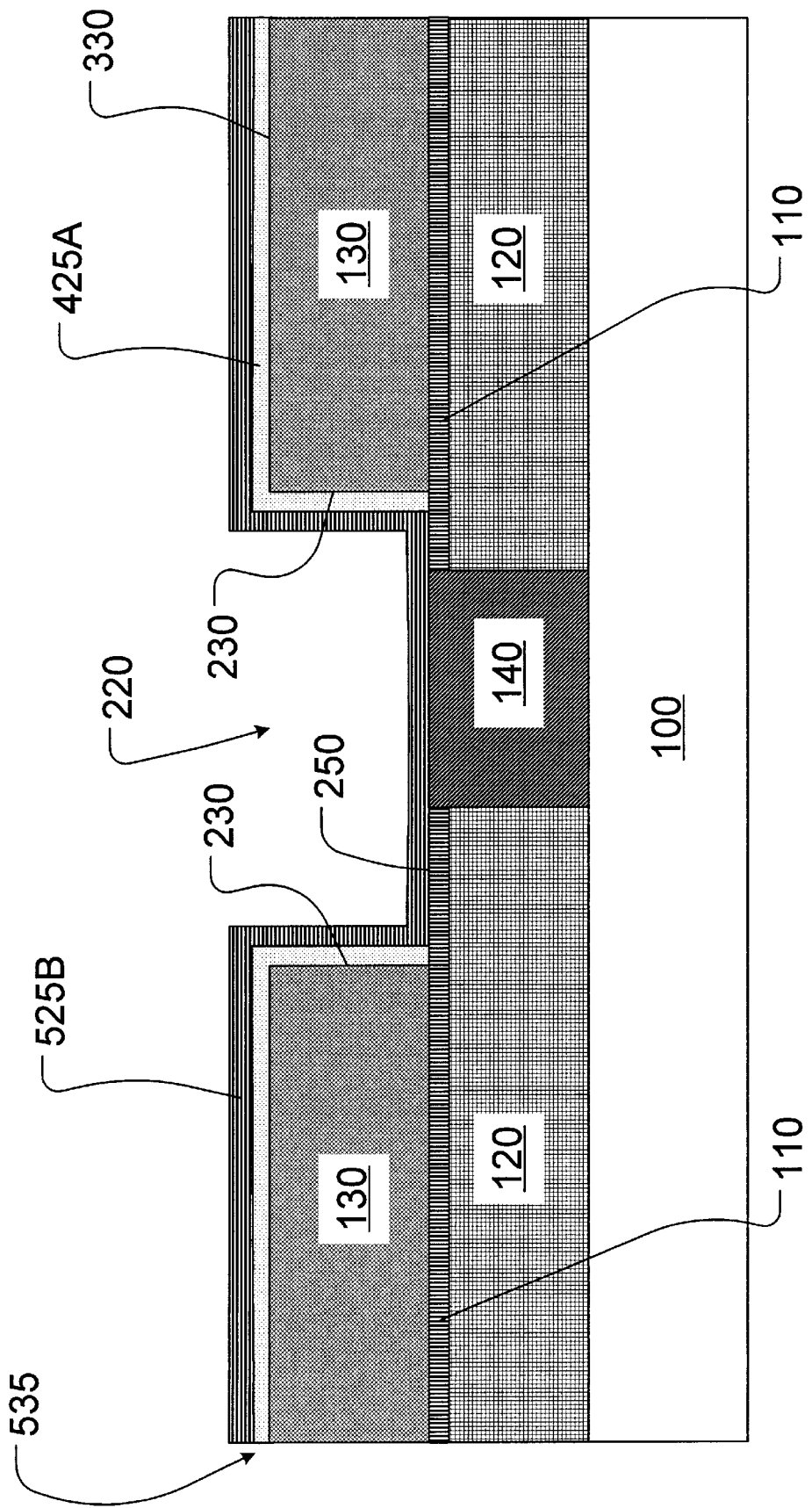

As shown in FIG. 5, a conductive seed layer 525B (of copper, for example) is then applied to the entire surface using vapor-phase deposition (FIG. 5). The one or more reduced barrier metal layer(s) 425A and/or the conductive seed layer 525B blanket-deposit the entire upper surface 330 of the second dielectric layer 130 as well as the side surfaces 230 and the bottom surface 250 of the opening 220, forming a conductive surface 535, as shown in FIG. 5. In particular, the conductive seed layer 525B directly contacts the first conductive structure 140 without any barrier metal layer 325A (FIG. 3) intervening therebetween. The conductive seed layer 525B may be formed on top of, and adjacent, the one or more reduced barrier metal layer(s) 425A by physical vapor deposition (PVD) or chemical vapor deposition (CVD), for example. It is believed that the etch stop layer 110 will protect the first dielectric layer 120 from being poisoned by atoms of the conductive material (such as Cu atoms) diffusing from the conductive seed layer 525B above the bottom surface 250 of the opening 220.

The bulk of the copper trench-fill is frequently done using an electroplating technique, where the conductive surface 535 is mechanically clamped to an electrode (not shown) to establish an electrical contact, and the structure 100 is then immersed in an electrolyte solution containing ions of a conductive material (such as Cu ions). An electrical current is then passed through the wafer-electrolyte system to cause reduction and deposition of the conductive material (such as Cu) on the conductive surface 535. In addition, an alternating-current bias of the wafer-electrolyte system has been considered as a method of self-planarizing the deposited conductive film, similar to the deposit-etch cycling used in high-density plasma (HDP) tetraethyl orthosilicate (TEOS) dielectric depositions.

Figure 6:
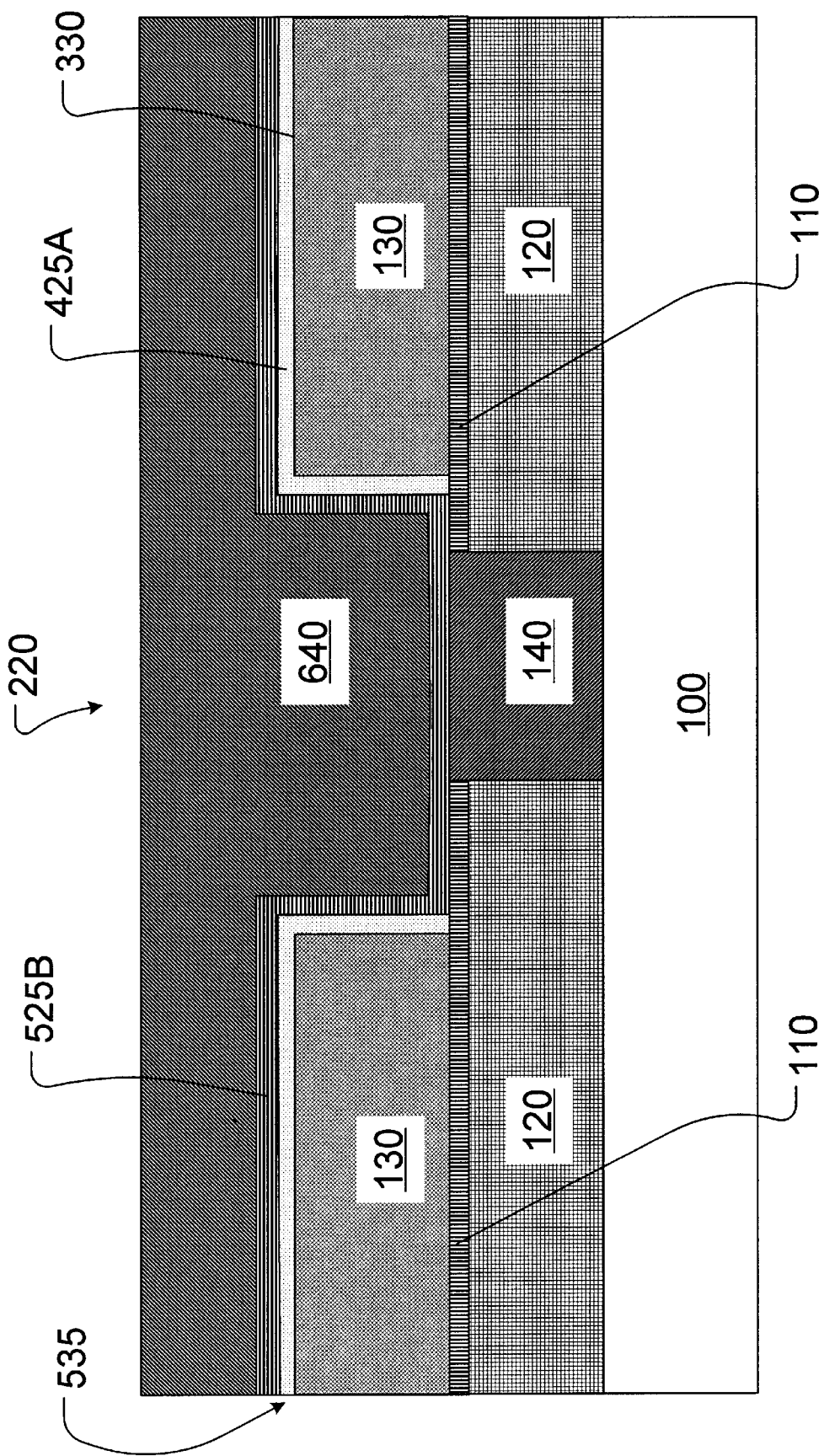

As shown in FIG. 6, this process typically produces a substantially level coating of conductive material 640 (such as Cu) of substantially constant thickness across the entire conductive surface 535.

Figure 7:
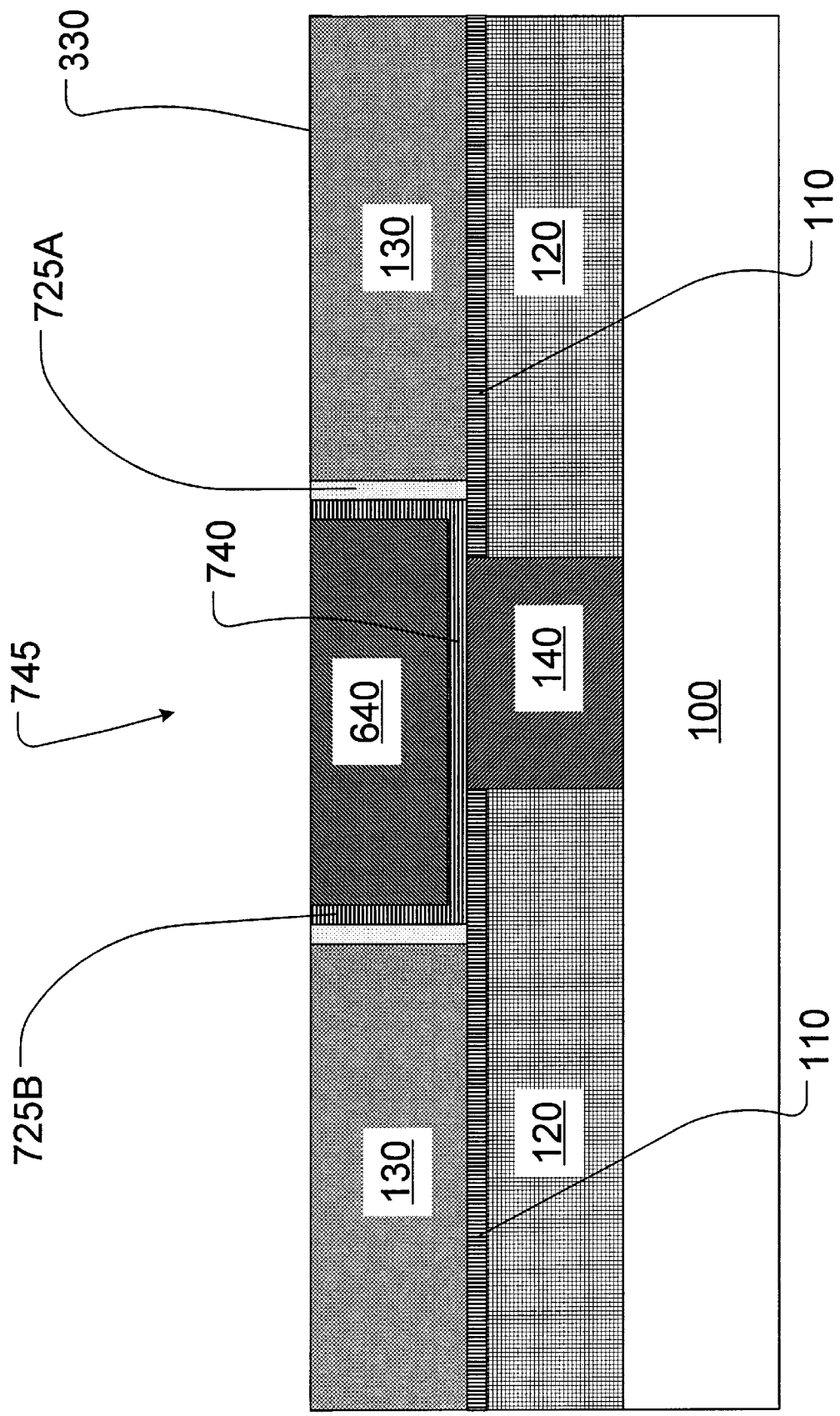

As shown in FIG. 7, the conductive material-interconnect 745 may be formed by annealing the conductive material 640, adjacent the remaining portions 725A and 725B of the one or more reduced barrier metal layers 425A and conductive seed layer 525B FIGS. 4–6), directly to the first conductive structure 140. In particular, since one of the remaining portions 740 of the conductive seed layer 725B directly contacts the first conductive structure 140 without any barrier metal layer 325A (FIG. 3) intervening therebetween, the electromigration performance of the conductive material-interconnect 745 may be improved. The formation of electromigration voids may be slowed down, for example, since the direct contact of the conductive material-interconnect 745 through the conductive seed layer 725B to the first conductive structure 140 improves conductivity and reduces local heating, and further allows atoms of the conductive material (such as Cu atoms) in the conductive material-interconnect 745 to diffuse into the first conductive structure 140 under the influence of the electron wind, improving the electromigration performance of the conductive material-interconnect 745. An anneal may also enable the electroplated copper (Cu) to have a defined grain orientation.

The anneal process may be performed in a traditional tube furnace, at a temperature ranging from approximately 150–400° C., for a time period ranging from approximately 15–180 minutes, in a nitrogen-containing ambient that may include at least one of ammonia ($NH_3$), argon (Ar), molecular nitrogen ($N_2$), and the like. Alternatively, the anneal process may be a rapid thermal anneal (RTA) process performed at a temperature ranging from approximately 150–400° C. for a time ranging from approximately 10–180 seconds in a nitrogen-containing ambient that may include at least one of argon (Ar), molecular nitrogen ($N_2$), and the like.

As shown in FIG. 7, once a sufficiently thick layer of conductive material 640 has been deposited, the layer of conductive material 640 is planarized using chemical mechanical polishing (CMP) techniques. The planarization using CMP clears all conductive material such as Cu) and barrier metal from the entire upper surface 330 of the second dielectric layer 130, leaving the conductive material 640 only in a second conductive structure such as a conductive material-filled trench, forming a conductive material-interconnect 745, adjacent remaining portions 725A and 725B of the one or more reduced barrier metal layers 425A and conductive seed layer 525B (FIGS. 4–6), respectively, as shown in FIG. 7.

Figure 8:
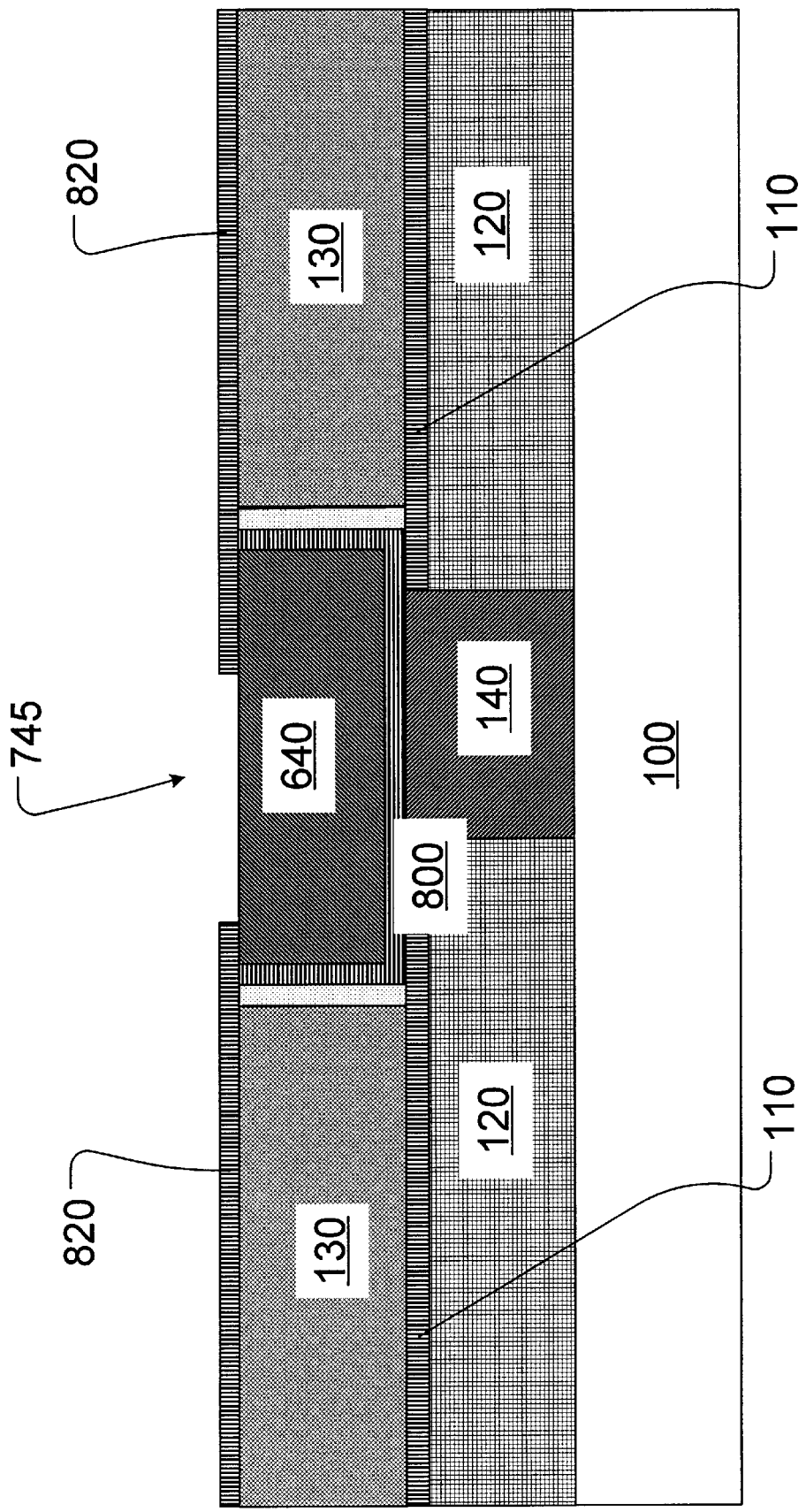

As shown in FIG. 8, the low K second dielectric layer 130 may also be planarized, as needed, using chemical mechanical polishing (CMP) techniques. In various illustrative embodiments, the planarization of the copper (Cu) and the second dielectric layer 130 may be performed sequentially in the same polisher, using different tables. Planarization would leave the planarized low K second dielectric layer 130 adjacent the conductive material-interconnect 745 and above the etch stop layer 110, forming a conductive material-interconnect layer 800. The conductive material-interconnect layer 800 may include the conductive material-interconnect 745, and may also include the etch stop layer 110. As shown in FIG. 8, the conductive material-interconnect layer 800 may also include an etch stop layer 820 (also known as a "hard mask" and typically formed of silicon nitride, $Si_3N_4$, or SiN, for short) formed and patterned above the second dielectric layer 130 and above at least a portion of the conductive material-interconnect 745.

Figure 9:
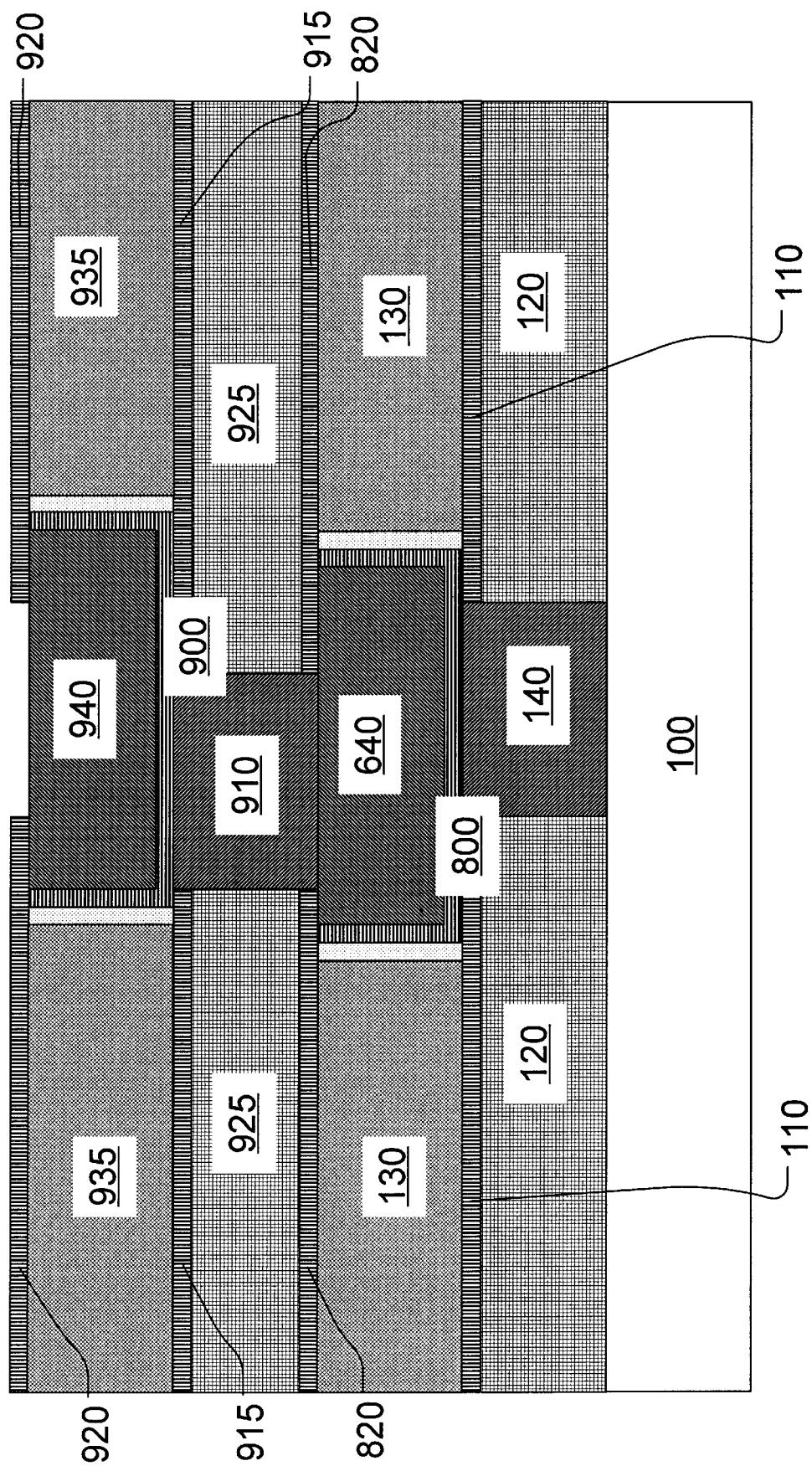
FIG. 9 schematically illustrates multiple layers of copper interconnects according to various embodiments of the present invention.

As shown in FIG. 9, the conductive material-interconnect layer 800 may be an underlying structure layer (similar to the structure 100) to a conductive material-interconnect layer 900. The conductive material-interconnect layer 900 may include a conductive material-filled trench 940 and an intermetal via connection 910. The intermetal via connection 910 may be a Cu structure similar to the first Cu structure 140, and the intermetal via connection 910 may be annealed to the conductive material-filled trench 940 in a similar fashion to the anneal described above in relation to the formation of the conductive material-interconnect 745 (FIG. 7). The conductive material-interconnect layer 900 may also include the etch stop layer 820, and/or etch stop layer 915 and/or etch stop layer 920 (also known as "hard masks" and typically formed of silicon nitride, $Si_3N_4$, or SiN, for short) formed and patterned above the planarized low K dielectric layers 925 and/or 935, respectively. The etch stop layer 920 may also be formed above at least a portion of the conductive material-filled trench 940.

Figure 10:
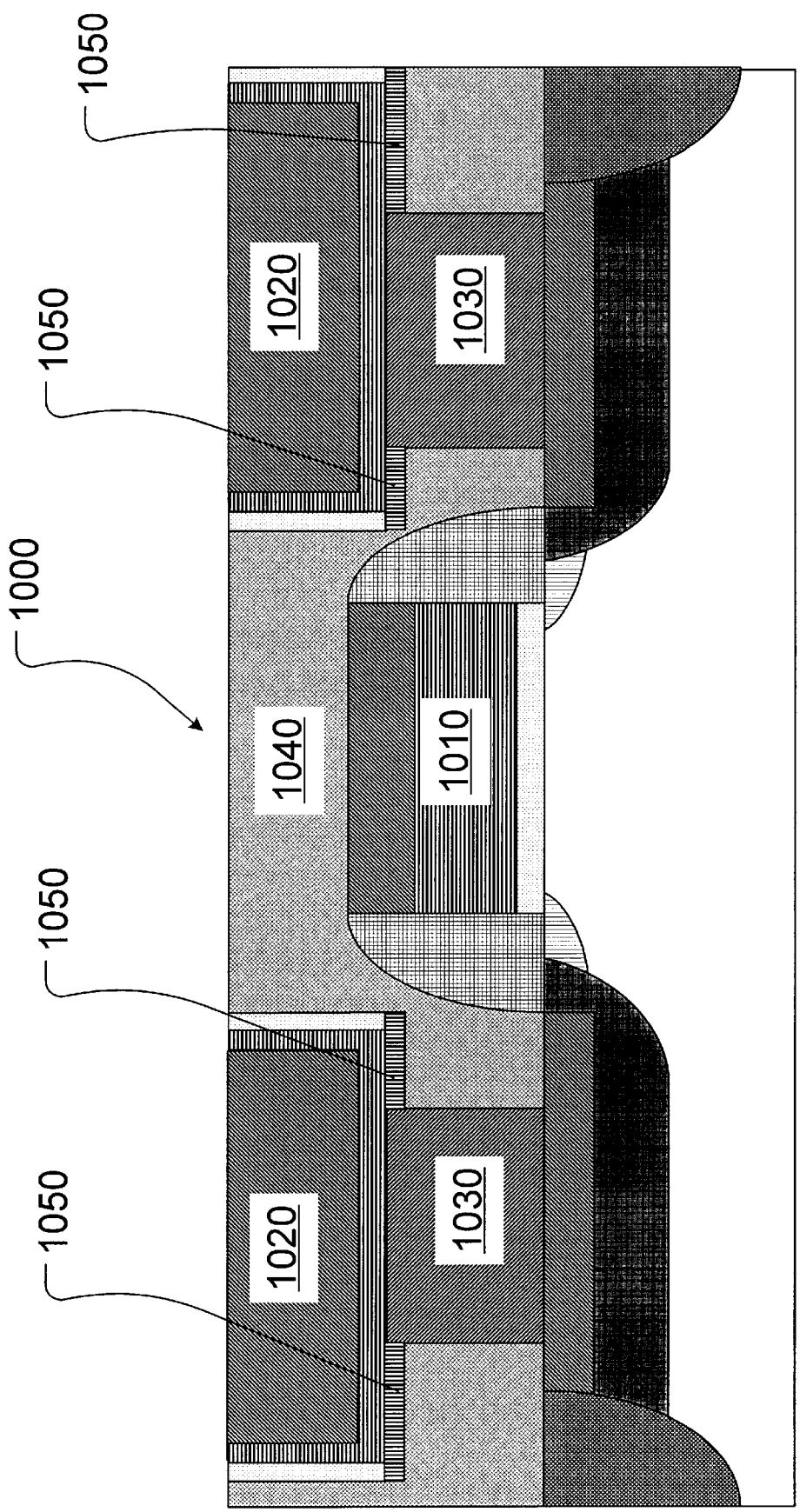
FIG. 10 schematically illustrates copper interconnects according to various embodiments of the present invention connecting source/drain regions of an MOS transistor.

As shown in FIG. 10, an MOS transistor 1010 may be an underlying structure layer (similar to the structure 100) to a conductive material-interconnect layer 1000. The conductive material-interconnect layer 1000 may include conductive material-filled trenches 1020 and tungsten (W) intermetal via connections 1030 adjacent a planarized low K dielectric layer 1040. The tungsten (W) intermetal via connections 1030 may be conductive structures similar to the first conductive structure 140, and the tungsten (W) intermetal via connections 1030 may be annealed to the second Cu structures 1020 in a similar fashion to the anneal described above in relation to the formation of the conductive material-interconnect 745 (FIG. 7). Diffusion barriers 1050 may be provided below the conductive material-filed trenches 1020 to prevent diffusion of copper (Cu) atoms into adjacent silicon-containing layers. The diffusion barriers 1050 may be formed of polyethylene naphthalate (PEN), such as Dupont's Kaladex® PEN film, having a dielectric constant K of about 3.4, for example.

Any of the above-disclosed embodiments of a method of forming a conductive interconnect enables a conductive interconnect to be formed having an improved electromigration performance. The formation of electromigration voids may be slowed down, for example, in a copper interconnect, since the direct copper-to-copper contact of a copper interconnect, formed according to any of the above-disclosed embodiments of a method of forming a conductive interconnect, with an underlying copper structure and/or line improves conductivity and reduces local heating, and further allows copper atoms in the copper interconnect to diffuse into the underlying copper structure and/or line under the influence of the electron wind, improving the electromigration performance of the copper interconnect.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below.

What is claimed:

1. A method of forming a conductive interconnect, the method comprising:

forming a first dielectric layer above a structure layer;

forming a first opening in the first dielectric layer;

forming a first conductive structure in the first opening;

forming a second dielectric layer above the first dielectric layer and above the first conductive structure;

forming a second opening in the second dielectric layer above at least a portion of the first conductive structure, the second opening having a side surface and a bottom surface;

forming at least one barrier metal layer in the second opening on the side surface and on the bottom surface;

removing a portion of the at least one barrier metal layer from the bottom surface;

forming a second conductive structure in the second opening, the second conductive structure contacting the at least the portion of the first conductive structure; and forming the conductive interconnect by annealing the second conductive structure and the first conductive structure.

2. The method of claim 1, further comprising:

forming a conductive seed layer in the second opening adjacent the at least one barrier metal layer in the second opening on the side surface and above the bottom surface.

3. The method of claim 2, further comprising:

planarizing the second dielectric layer, wherein forming the second dielectric layer comprises forming the second dielectric layer using a low dielectric constant (low K) dielectric material, having a dielectric constant K of at most about four.

4. The method of claim 3, further comprising:

forming and patterning a mask layer above the second dielectric layer to have a mask layer opening above at least a portion of the first conductive structure.

5. The method of claim 1, wherein forming the first dielectric layer comprises forming the first dielectric layer using a low dielectric constant (low K) dielectric material, having a dielectric constant K of at most about four, and forming the first dielectric layer using one of chemical vapor deposition (CVD), low-pressure CVD (LPCVD), plasma-enhanced CVD (PECVD), and spin-on glass.

6. The method of claim 1, wherein removing the portion of the at least one barrier metal layer from the bottom surface comprises removing the portion of the at least one barrier metal layer from the bottom surface using reverse electroplating.

7. The method of claim 1, wherein forming the second opening in the second dielectric layer comprises forming the second opening in the second dielectric layer using one of a mask of photoresist and an etch stop layer, the one of the mask of photoresist and the etch stop layer being formed and patterned above the second dielectric layer.

8. The method of claim 7, wherein using the one of the mask of photoresist and the etch stop layer comprises using the etch stop layer being formed of silicon nitride.

9. The method of claim 1, wherein forming the second conductive structure comprises forming the second conductive structure using electrochemical deposition of conductive material.

10. The method of claim 9, wherein using the electrochemical deposition of the conductive material comprises forming the at least one barrier layer and a conductive seed layer in the second opening before the electrochemical deposition of the conductive material, and planarizing the conductive material using chemical mechanical polishing after the electrochemical deposition of the conductive material.

11. A method of forming a copper interconnect, the method comprising:
    forming a first dielectric layer above a structure layer;
    forming a first opening in the first dielectric layer;
    forming a first copper layer above the first dielectric layer and in the first opening;
    forming a copper structure by removing portions of the copper layer above the first dielectric layer, leaving the copper structure in the first opening;
    forming a second dielectric layer above the first dielectric layer and above the copper structure;
    forming a second opening in the second dielectric layer above at least a portion of the copper structure, the second opening having a side surface and a bottom surface;
    forming at least one barrier metal layer in the second opening on the side surface and on the bottom surface;
    removing a portion of the at least one barrier metal layer from the bottom surface;
    forming a second copper layer above the second dielectric layer and in the second opening, the second copper layer contacting the at least the portion of the copper structure;
    annealing the second copper layer; and
    forming the copper interconnect by removing portions of the second copper layer above the second dielectric layer, leaving the copper interconnect in the second opening.

12. The method of claim 11, further comprising:
    forming a copper seed layer in the second opening adjacent the at least one barrier metal layer in the second opening on the side surface and above the bottom surface.

13. The method of claim 12, further comprising:
    planarizing the second dielectric layer, wherein forming the second dielectric layer comprises forming the second dielectric layer using a low dielectric constant (low K) dielectric material, having a dielectric constant K of at most about four.

14. The method of claim 13, further comprising:
    forming and patterning a mask layer above the second dielectric layer to have a mask layer opening above at least a portion of the copper interconnect.

15. The method of claim 11, wherein forming the first dielectric layer comprises forming the first dielectric layer using a low dielectric constant (low K) dielectric material, having a dielectric constant K of at most about four, and forming the first dielectric layer using one of chemical vapor deposition (CVD), low-pressure CVD (LPCVD), plasma-enhanced CVD (PECVD), and spin-on glass.

16. The method of claim 11, wherein removing the portion of the at least one barrier metal layer from the bottom surface comprises removing the portion of the at least one barrier metal layer from the bottom surface using reverse electroplating.

17. The method of claim 11, wherein forming the second opening in the second dielectric layer comprises forming the second opening in the second dielectric layer using one of a mask of photoresist and an etch stop layer, the one of the mask of photoresist and the etch stop layer being formed and patterned above the second dielectric layer.

18. The method of claim 17, wherein using the one of the mask of photoresist and the etch stop layer comprises using the etch stop layer being formed of silicon nitride.

19. The method of claim 11, wherein forming the second copper layer comprises forming the second copper layer using electrochemical deposition of copper.

20. The method of claim 19, wherein using the electrochemical deposition of the copper comprises forming the at least one barrier layer and a conductive seed layer in the second opening before the electrochemical deposition of the copper, and removing portions of the second copper layer comprises planarizing the copper using chemical mechanical polishing after the electrochemical deposition of the copper.

21. A method of forming a copper interconnect, the method comprising:
    forming a first dielectric layer above a structure layer;
    forming a first opening in the first dielectric layer;
    forming a copper-filled via in the first opening;
    forming a second dielectric layer above the first dielectric layer and above the copper-filled via;
    forming a second opening in the second dielectric layer above at least a portion of the copper-filled via, the second opening having a side surface and a bottom surface;
    forming at least one barrier metal layer in the second opening on the side surface and on the bottom surface;
    removing a portion of the at least one barrier metal layer from the bottom surface;
    forming a copper line in the second opening, the copper line contacting the at least the portion of the copper-filled via;
    removing the second dielectric layer above the first dielectric layer and adjacent the copper line; and
    forming the copper interconnect by annealing the copper line and the copper-filled via.

22. The method of claim 21, further comprising:
    forming a copper seed layer in the second opening adjacent the at least one barrier metal layer in the second opening on the side surface and above the bottom surface.

23. The method of claim 22, further comprising:
    planarizing the second dielectric layer, wherein forming the second dielectric layer comprises forming the second dielectric layer using a low dielectric constant (low K) dielectric material, having a dielectric constant K of at most about four.

24. The method of claim 23, further comprising:
    forming and patterning a mask layer above the second dielectric layer to have a mask layer opening above at least a portion of the copper line.

25. The method of claim 21, wherein forming the first dielectric layer comprises forming the first dielectric layer using a low dielectric constant (low K) dielectric material, having a dielectric constant K of at most about four, and forming the first dielectric layer using one of chemical vapor deposition (CVD), low-pressure CVD (LPCVD), plasma-enhanced CVD (PECVD), and spin-on glass.

26. The method of claim 21, wherein removing the portion of the at least one barrier metal layer from the bottom surface comprises removing the portion of the at least one barrier metal layer from the bottom surface using reverse electroplating.

27. The method of claim 21, wherein forming the second opening in the second dielectric layer comprises forming the second opening in the second dielectric layer using one of a mask of photoresist and an etch stop layer, the one of the mask of photoresist and the etch stop layer being formed and patterned above the second dielectric layer.

28. The method of claim 27, wherein using the one of the mask of photoresist and the etch stop layer comprises using the etch stop layer being formed of silicon nitride.

29. The method of claim 21, wherein forming the second copper layer comprises forming the second copper layer using electrochemical deposition of copper.

30. The method of claim 29, wherein using the electrochemical deposition of the copper comprises forming the at least one barrier layer and a conductive seed layer in the second opening before the electrochemical deposition of the copper, and planarizing the copper using chemical mechanical polishing after the electrochemical deposition of the copper.

31. A method of forming a copper interconnect, the method comprising:

forming a first dielectric layer above a structure layer;

forming a first opening in the first dielectric layer;

forming a first copper layer above the first dielectric layer and in the first opening;

forming a copper-filled via by removing portions of the first copper layer above the first dielectric layer, leaving the copper-filled via in the first opening;

forming a second dielectric layer above the first dielectric layer and above the copper-filled via;

forming a second opening in the second dielectric layer above at least a portion of the copper-filled via, the second opening having a side surface and a bottom surface;

forming at least one barrier metal layer in the second opening on the side surface and on the bottom surface;

removing a portion of the at least one barrier metal layer from the bottom surface;

forming a second copper layer above the second dielectric layer and in the second opening, the second copper layer contacting the at least the portion of the copper-filled via;

annealing the second copper layer;

forming the copper interconnect by removing portions of the second copper layer above the second dielectric layer, leaving the copper interconnect in the second opening;

removing the second dielectric layer above the first dielectric layer and adjacent the copper interconnect; and annealing the copper interconnect.

32. The method of claim 31, further comprising:

forming a copper seed layer in the second opening adjacent the at least one barrier metal layer in the second opening on the side surface and above the bottom surface.

33. The method of claim 32, further comprising:

planarizing the second dielectric layer, wherein forming the second dielectric layer comprises forming the second dielectric layer using a low dielectric constant (low K) dielectric material, having a dielectric constant K of at most about four.

34. The method of claim 33, further comprising:

forming and patterning a mask layer above the second dielectric layer to have a mask layer opening above at least a portion of the copper interconnect.

35. The method of claim 31, wherein forming the first dielectric layer comprises forming the first dielectric layer using a low dielectric constant (low K) dielectric material, having a dielectric constant K of at most about four, and forming the first dielectric layer using one of chemical vapor deposition (CVD), low-pressure CVD (LPCVD), plasma-enhanced CVD (PECVD), and spin-on glass.

36. The method of claim 31, wherein removing the portion of the at least one barrier metal layer from the bottom surface comprises removing the portion of the at least one barrier metal layer from the bottom surface using reverse electroplating.

37. The method of claim 31, wherein forming the second opening in the second dielectric layer comprises forming the second opening in the second dielectric layer using one of a mask of photoresist and an etch stop layer, the one of the mask of photoresist and the etch stop layer being formed and patterned above the second dielectric layer.

38. The method of claim 37, wherein using the one of the mask of photoresist and the etch stop layer comprises using the etch stop layer being formed of silicon nitride.

39. The method of claim 31, wherein forming the second copper layer comprises forming the second copper layer using electrochemical deposition of copper.

40. The method of claim 39, wherein using the electrochemical deposition of the copper comprises forming the at least one barrier layer and a conductive seed layer in the second opening before the electrochemical deposition of the copper, and removing portions of the second copper layer comprises planarizing the copper using chemical mechanical polishing after the electrochemical deposition of the copper.

* * * * *